(12) United States Patent
Kawaguchi et al.

(10) Patent No.: US 6,297,534 B1
(45) Date of Patent: Oct. 2, 2001

(54) POWER SEMICONDUCTOR DEVICE

(75) Inventors: Yusuke Kawaguchi; Kazutoshi Nakamura; Akio Nakagawa, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/413,811

(22) Filed: Oct. 7, 1999

(30) Foreign Application Priority Data

Oct. 7, 1998 (JP) ................................................. 10-285455

(51) Int. Cl.$^7$ .................................................... H01L 29/76
(52) U.S. Cl. .......................... 257/341; 257/401; 438/156; 438/268
(58) Field of Search ..................................... 257/341, 342, 257/343, 401, 492, 493; 438/156, 268

(56) References Cited

U.S. PATENT DOCUMENTS

| 5,798,554 | * | 8/1998 | Grimaldi et al. | 257/401 |
| 6,081,009 | * | 6/2000 | Neilson | 257/341 |
| 6,097,063 | * | 8/2000 | Fujihira | 257/339 |

FOREIGN PATENT DOCUMENTS 9-266311    10/1997    (JP) .

OTHER PUBLICATIONS

Jpn. J. Appl. Phys. vol. 36 (1997) pp. 6254–6262; Part 1, No. 10 Oct. 1997; T. Fujihira.

* cited by examiner

*Primary Examiner*—Nathan Flynn
*Assistant Examiner*—Remmon R. Fordé
(74) *Attorney, Agent, or Firm*—Oblon, Spivak, McClelland, Maier & Neustadt, P.C.

(57) ABSTRACT

A first conductivity type active layer having high resistance is provided on an insulation region. A second conductivity type base layer is selectively formed on a surface of the first conductivity type active layer. A first conductivity type source layer is selectively formed on a surface of the second conductivity type base layer. A first conductivity type drain layer is selectively formed on a surface of the first conductivity type active layer. A gate electrode is formed facing, through a gate insulating film, a surface region of the second conductivity type base layer between the first conductivity type source layer and the first conductivity type active layer. A plurality of first and second conductivity type semiconductor regions are formed between the second conductivity type base layer and the first conductivity type drain layer. Each of the second conductivity type semiconductor regions is arranged alternately with each of the first conductivity type semiconductor regions. A drain current flows from the first conductivity type source layer to the first conductivity type drain layer through the first conductivity type semiconductor regions. Bottom portions of the second conductivity type semiconductor regions are shallower than the interface between the first conductivity type active layer and the insulation region. According to the present invention, low ON resistance and high withstand voltage are realized at the same time.

30 Claims, 8 Drawing Sheets

POWER SEMICONDUCTOR DEVICE

BACKGROUND OF THE INVENTION

1. Field of the Invention

The present invention relates to a power semiconductor device having a lateral power MOSFET.

2. Discussion of the Background

A lateral power MOSFET as one of high withstand voltage elements to be used in a power semiconductor device is known. FIG. 10 shows a sectional perspective view of a background lateral power MOSFET. FIG. 11 shows a plan view of the same lateral power MOSFET, FIG. 12 a sectional view taken along line A–A' in FIG. 11, FIG. 13 a sectional view taken along line B–B' in FIG. 11, and FIG. 14 a sectional view taken along line C–C' in FIG. 11.

The background lateral power MOSFET includes drift layers formed in a stripe form having $n^-$ semiconductor layers 81 (described as $n^-$ drift layers 81) and $p^-$ semiconductor layers 82 (described as $p^-$ drift layers 82) alternately formed along a channel width direction. The alternately formed structure having the $n^-$ drift layers 81 and $p^-$ drift layers 82 as such is referred to as a multi-resurf layer.

In FIGS. 10 to 14, 83 represents a support substrate, 84 a buried oxide film, 85 an $n^-$ active layer, 86 a p body layer, 87 an $n^+$ source diffusion layer, 88 a $p^+$ contact layer, 89 a gate oxide film, 90 a gate electrode, 91 an $n^+$ drain diffusion layer, 92 a drain electrode, and 93 a source electrode.

In the structure as described above, a voltage below a threshold voltage, for example 0 V or a negative voltage, is applied to the gate electrode 90. The source electrode 93 is provided with the same voltage as the gate electrode 90. A voltage higher than that applied to the gate electrode 90 and lower than that applied to the drain electrode 92 may be applied to the source electrode 93 to turn off the device. Thereupon, a depletion layer 94 possibly occurs from a pn junction interface of a $n^-$ drift layer 81 and a $p^-$ drift layer 82, as shown in FIG. 11.

The drift layers 81, 82 are narrow in stripe width. Accordingly, complete depletion readily occurs as compared to a structure without $p^-$ drift layers 82, i.e., as compared to a structure to cause complete depletion of the drift layers due to depletion directed from the gate electrode 90 toward the $n^+$ drain layer 91. This allows the drift layers 81 to have an increased impurity dosage, and to hence reduce ON resistance.

On the other hand, as shown in FIG. 12, a depletion layer 95 also occurs from an interface of the buried oxide film 84 and the $n^-$ drift layers 81. When the depletion layer 95 spreads over the entire $n^-$ drift layers 81, the depletion layer 94 stops spreading.

If the $p^-$ drift layers 82 have not been completely depleted, undepleted regions will be left in part of the $p^-$ drift layers 82. In particular, as shown in FIG. 12, undepleted regions are liable to occur in a lower portion 96 of the $p^-$ drift layers 82. The undepleted regions, if left, cause a problem that high withstand voltage as expected is not obtainable.

As discussed above, although the background lateral power MOSFET having the $n^-$ drift layers and the $p^-$ drift layers (multi-resurf layer) have had the advantage of reducing ON resistance to be low, there has been a problem that high withstand voltage as expected is not obtainable due to undepleted regions left in part of the $p^-$ drift layers.

SUMMARY OF THE INVENTION

It is an object of the present invention to provide a power semiconductor device provided with a lateral power MOSFET having $n^-$ drift layers and $p^-$ drift layers and which has a low ON resistance and high withstand voltage.

To achieve the above and other objects, a power semiconductor device according to the present invention includes: a first conductivity type active layer provided on an insulation region and having high resistance; a second conductivity type base layer selectively formed on a surface of the first conductivity type active layer; a first conductivity type source layer selectively formed on a surface of the second conductivity type base layer; a first conductivity type drain layer selectively formed on a surface of the first conductivity type active layer; a gate electrode facing, through a gate insulating film, a surface region of the second conductivity type base layer between the first conductivity type source layer and the first conductivity type active layer; and, a plurality of first and second conductivity type semiconductor regions formed between the second conductivity type base layer and the first conductivity type drain layer. Further, each of the second conductivity type semiconductor regions is arranged alternately with each of the first conductivity type semiconductor regions. A drain current flows from the first conductivity type source layer to the first conductivity type drain layer through the first conductivity type semiconductor regions. Bottom portions of the second conductivity type semiconductor regions are shallower than the interface between the first conductivity type active layer and the insulation region.

Also, another power semiconductor device according to the present invention includes: a first conductivity type active layer provided on an insulation region and having high resistance; a second conductivity type base layer selectively formed on a surface of the first conductivity type active layer; a first conductivity type source layer selectively formed on a surface of the second conductivity type base layer; a first conductivity type drain layer selectively formed on a surface of the first conductivity type active layer; a gate electrode facing, through a gate insulating film, a surface region of the second conductivity type base layer between the first conductivity type source layer and the first conductivity type active layer; and, a plurality of first and second conductivity type semiconductor regions formed between the second conductivity type base layer and the first conductivity type drain layer and formed above the insulation region with the first conductivity type active layer therebetween. Each of the second conductivity type semiconductor regions is arranged alternately with each of the first conductivity type semiconductor regions and is arranged in a direction crossing a direction from the first conductivity type source layer to the first conductivity type drain layer.

Also, another power semiconductor device according to the present invention includes: a first conductivity type active layer provided on an insulation region and having high resistance; a second conductivity type base layer selectively formed on a surface of the first conductivity type active layer; a first conductivity type source layer selectively formed on a surface of the second conductivity type base layer; a first conductivity type drain layer selectively formed on a surface of the first conductivity type active layer; a gate electrode facing, through a gate insulating film, a surface region of the second conductivity type base layer between the first conductivity type source layer and the first conductivity type active layer; and, a plurality of first and second conductivity type semiconductor regions formed between the second conductivity type base layer and the first conductivity type drain layer and formed on a surface of the first conductivity type active layer. Each of the second conductivity type semiconductor regions is arranged alternately with each of the first conductivity type semiconductor regions. A drain current flows from the first conductivity type source layer to the first conductivity type drain layer through the first conductivity type semiconductor regions. The plurality of first and second conductivity type semiconductor regions are completely depleted from junction interfaces thereof before a depletion layer extending from a surface of the insulation region reaches bottom portions of the second conductivity type semiconductor regions.

Also, another power semiconductor device according to the present invention includes: a first conductivity type active layer formed on a second conductivity type semiconductor substrate and having high resistance; a second conductivity type base layer selectively formed on a surface of the first conductivity type active layer; a first conductivity type source layer selectively formed on a surface of the second conductivity type base layer; a first conductivity type drain layer selectively formed on a surface of the first conductivity type active layer; a gate electrode facing, through a gate insulating film, a surface region of the second conductivity type base layer between said first conductivity type source layer and the first conductivity type active layer; and, a plurality of first and second conductivity type semiconductor regions formed between the second conductivity type base layer and the first conductivity type drain layer. Each of the second conductivity type semiconductor regions is arranged alternately with each of the first conductivity type semiconductor regions. A drain current flows from the first conductivity type source layer to the first conductivity type drain layer through the first conductivity type semiconductor regions. Bottom portions of the second conductivity type semiconductor regions are shallower than the interface between the first conductivity type active layer and the second conductivity type semiconductor substrate.

Also, another power semiconductor device according to the present invention includes: a first conductivity type active layer formed on a second conductivity type semiconductor substrate and having high resistance; a second conductivity type base layer selectively formed on a surface of the first conductivity type active layer; a first conductivity type source layer selectively formed on a surface of the second conductivity type base layer; a first conductivity type drain layer selectively formed on a surface of the first conductivity type active layer; a gate electrode facing, through a gate insulating film, a surface region of the second conductivity type base layer between the first conductivity type source layer and the first conductivity type active layer; and, a plurality of first and second conductivity type semiconductor regions formed between the second conductivity type base layer and the first conductivity type drain layer and formed above the second conductivity type semiconductor substrate with the first conductivity type active layer therebetween. Each of the second conductivity type semiconductor regions is arranged alternately with each of the first conductivity type semiconductor regions and is arranged in a direction crossing a direction from the first conductivity type source layer to the first conductivity type drain layer.

Also, another power semiconductor device according to the present invention includes: a first conductivity type active layer formed on a second conductivity type semiconductor substrate and having high resistance; a second conductivity type base layer selectively formed on a surface of the first conductivity type active layer; a first conductivity type source layer selectively formed on a surface of the second conductivity type base layer; a first conductivity type drain layer selectively formed on a surface of the first conductivity type active layer; a gate electrode facing, through a gate insulating film, a surface region of the second conductivity type base layer between the first conductivity type source layer and the first conductivity type active layer; and, a plurality of first and second conductivity type semiconductor regions formed between the second conductivity type base layer and the first conductivity type drain layer and formed on a surface of the first conductivity type active layer. Each of the second conductivity type semiconductor regions is arranged alternately with each of the first conductivity type semiconductor regions. A drain current flows from the first conductivity type source layer to the first conductivity type drain layer through the first conductivity type semiconductor regions. The plurality of first and second conductivity type semiconductor regions are completely depleted from junction interfaces thereof before a depletion layer extending from a surface of the second conductivity type semiconductor substrate reaches bottom portions of the second conductivity type semiconductor regions.

A preferred embodiment of the present invention is as follows.

(1) A dosage of a first conductivity type impurity in the first conductivity type active layer is in the range from $1.0 \times 10^{12}$ cm$^{-2}$ to $2.5 \times 10^{12}$ cm$^{-2}$ (and more preferably to $2.0 \times 10^{12}$ cm$^{-2}$).

(2) The plurality of first and second conductivity type semiconductor regions are arranged at a pitch of repetition of from 0.1 $\mu$m to 5 $\mu$m (and more preferably 0.5 $\mu$m to 5 $\mu$m).

(3) A dosage of the first conductivity type semiconductor regions is in the range from $1.0 \times 10^{12}$ cm$^{-2}$ to $5.0 \times 10^{12}$ cm$^{-2}$ in a direction of arrangement thereof.

(4) A dosage of the second conductivity type semiconductor regions is in the range from $1.0 \times 10^{12}$ cm$^{-2}$ to $5.0 \times 10^{12}$ cm$^{-2}$ in a direction of arrangement thereof.

(5) Each of the plurality of first and second conductivity type semiconductor regions is formed in a striped pattern.

Moreover, in the present invention the first conductivity type drift layer may be a first conductivity type active layer itself or one separately formed.

Also, the second conductivity type drift layer may be formed, for example, by forming a stripe form of grooves on a surface of the first conductivity type semiconductor layer and epitaxially growing a second conductivity type semiconductor layer within the grooves.

According to the present invention, because the second conductivity type semiconductor layer (described as a second conductivity type drift layer) does not reach the insulation film, no depletion layer is formed in the first conductivity type semiconductor layer (described as a first conductivity type drift layer) close to the bottom portion of the second conductivity type drift layer before a depletion layer of the first connectivity type drift layer reaches the second conductivity type drift layer upward from a surface of the insulation film. As a result, if a distance between the second conductivity type drift layer and the insulation film is selected to cause the first conductivity type drift layer and the second conductivity type drift layer to completely deplete due to the depletion from the pn junction interface of the first conductivity type drift layer and the second conductivity type drift layer before a depletion layer of the first conductivity type drift layer reaches a bottom portion of the second conductivity type drift layer, no undepleted region is left in part of the second conductivity type drift layer. Thus, high withstand voltage can be realized.

The realization of such complete depletion on the first conductivity type drift layer and second conductivity type drift layer makes it possible to increase the dosage of an impurity in the first conductivity type drift layer, and hence reduce ON resistance.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
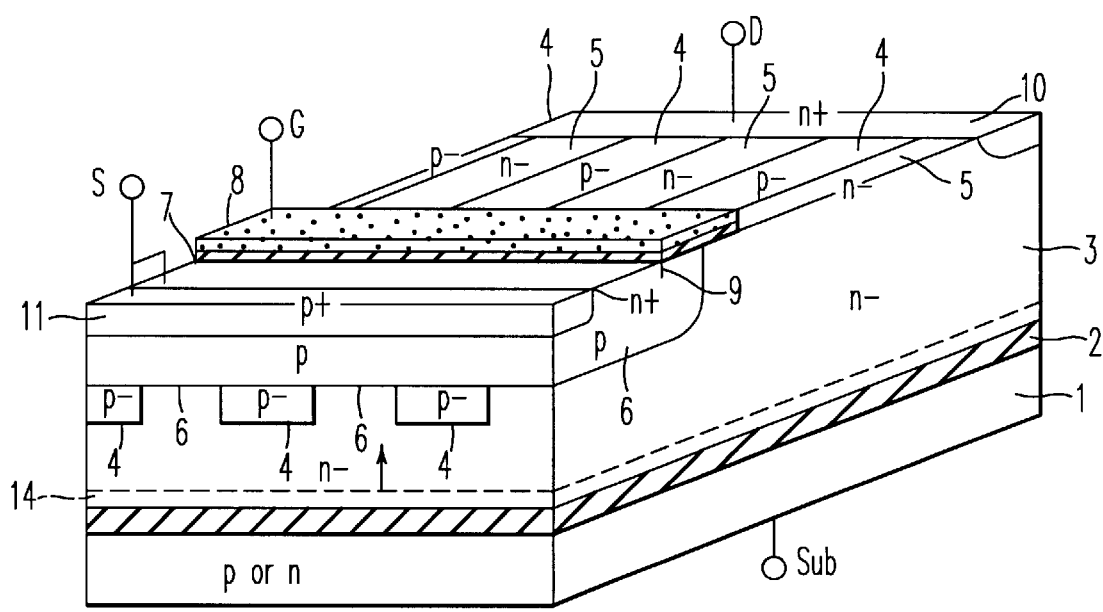
FIG. 1 is a sectional perspective view of a lateral power MOSFET having a multi-resurf layer according to the first embodiment of the present invention.

Embodiments of the present invention will now be described with reference to the drawings, in which like reference numerals represent identical or corresponding elements.

Figure 2:
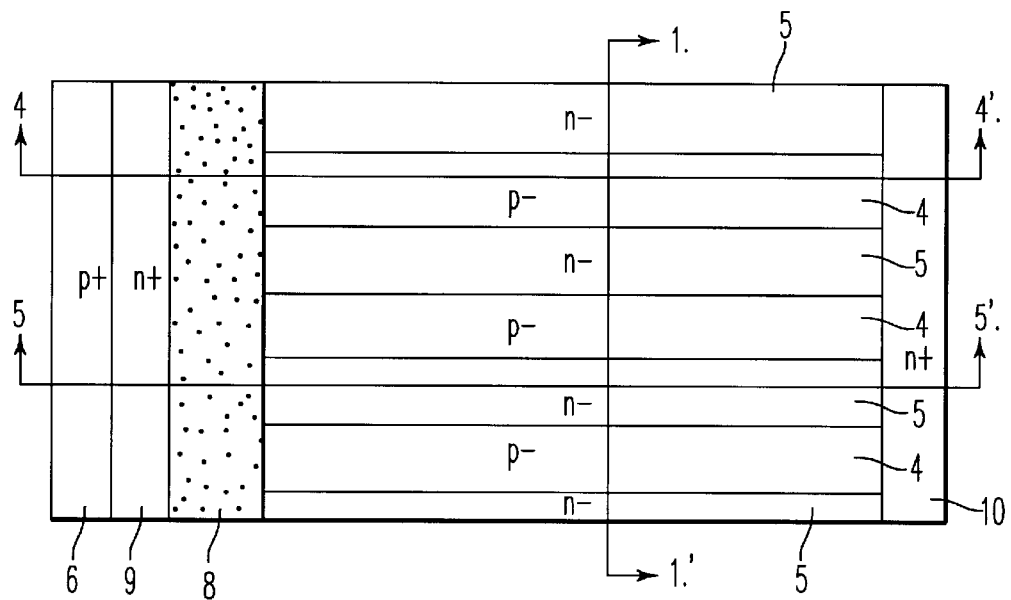
FIG. 2 is a plan view of the power MOSFET shown in FIG. 1.
Figure 3:
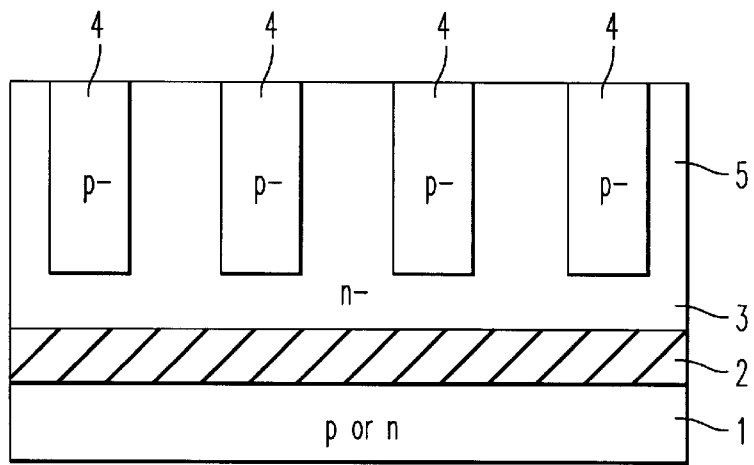
FIG. 3 is a sectional view taken along line A–A' in FIG. 2.
Figure 4:
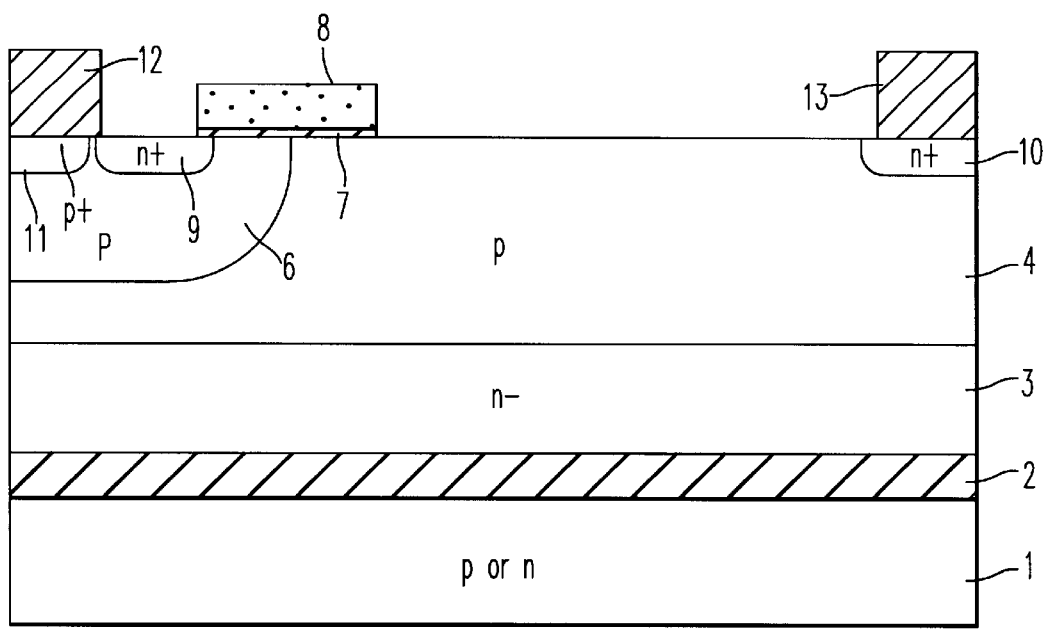
FIG. 4 is a sectional view taken along line B–B' in FIG. 2.
Figure 5:
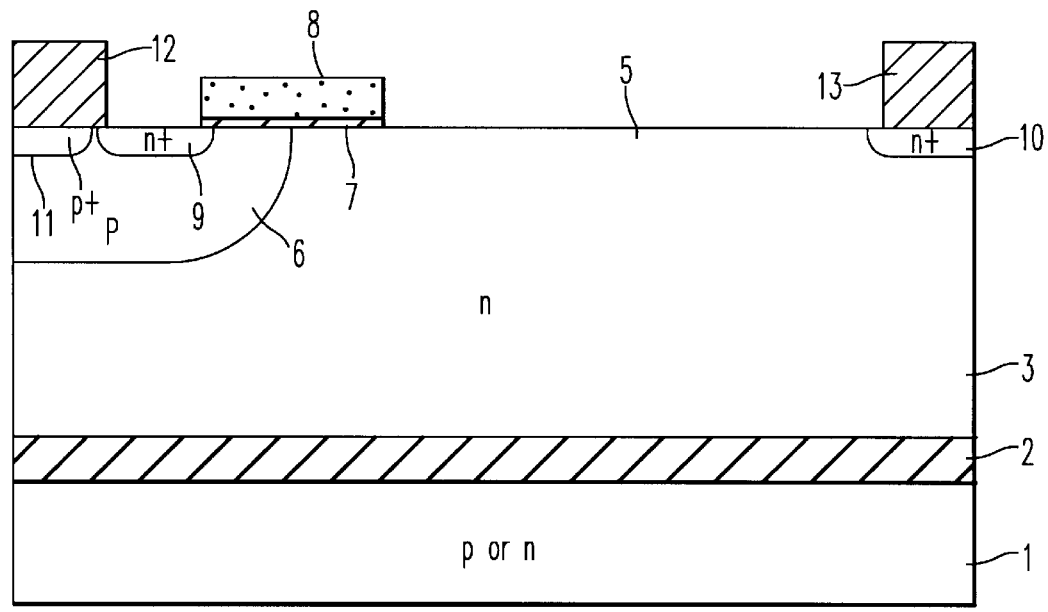
FIG. 5 is a sectional view taken along line C–C' in FIG. 2.

FIG. 1 illustrates a sectional perspective view of a lateral power MOSFET having a multi-resurf layer according to the first embodiment of the present invention, while FIG. 2 shows a plan view of the lateral power MOSFET. FIG. 3 shows a sectional view taken along line A–A' in FIG. 2, FIG. 4 shows a sectional view taken along line B–B' in FIG. 2, and FIG. 5 shows a sectional view taken along line C–C' in FIG. 2.

In FIGS. 1 to 5, a support semiconductor substrate (such as a silicon substrate) is denoted as 1. An n⁻ active layer 3 is provided on the support substrate 1 through a buried oxide film 2. The support substrate 1, buried oxide film 2, and n⁻ active layer 3 constitute an SOI (Silicon On Insulator) substrate, which is preferably formed by using, for example, a direct bonding technique. The support substrate 1 may be a p or n conductivity type.

In this embodiment, a lateral power MOSFET is formed on the SOI substrate constructed as above. Although in FIGS. 1 to 5 only one lateral power MOSFET is shown, a number of such elements may be formed. Furthermore, elements other than the lateral MOSFET may also be formed to constitute a power semiconductor device.

Now the present device will be described according to its manufacturing process. It should be noted that the present invention is not limited to the manufacturing process.

First, a plurality of trenches are formed on a surface of the n⁻ active layer 3 at a predetermined interval, each of which has a predetermined width. Next, p⁻ semiconductor layers 4 are respectively formed inside these trenches by using the epitaxial growth technique.

As a result, a drift layer (multi-resurf layer) is obtained in which stripe-formed p⁻ semiconductor layers 4 and n⁻ semiconductor layers 5 (described as p⁻ drift layers 4 and n⁻ drift layers 5) are formed alternately. The n⁻ drift layers 5 correspond to surface portions of the n⁻ active layer 3. It should be noted that the p⁻ drift layers 4 do not reach the buried oxide film 2, in contrast to the background art structure shown in FIGS. 10–14. The above-mentioned predetermined interval and predetermined width are discussed later.

Next, a p body layer 6 is selectively formed on the surface of the n⁻ active layer 3 shallower than the p⁻ drift layers 4. Then, a gate oxide film 7 and a gate electrode 8 are formed, extending in a perpendicular direction with respect to the longitudinal direction of the multi-resurf layer.

Next, a resist (not shown) is formed on the multi-resurf layer. Using the resist and the gate electrode 8 as a mask, an n⁺ source diffusion layer 9 and an n⁺ drain diffusion layer 10 are formed. The n⁺ source diffusion layer 9 is formed in a self-aligned manner. Thereafter, the resist is stripped away.

Finally, a p⁺ contact layer 11, a source electrode 12, and a drain electrode 13 are formed. Thus, a lateral power MOSFET is completed having a multi-resurf layer formed by the striped p⁻ drift layers 4 and n⁻ drift layers 5 that extend from the p body layer 6 to the n⁺ drain layer 10.

In the present invention, as shown in FIG. 1, a depletion layer 14 occurs from an interface of the buried oxide film 2 and n⁻ active layers 3. It should be noted that in the present device the p⁻ drift layers 4 are formed not to reach the buried oxide film 2. As a result, if a distance between the p⁻ drift layers 4 and the buried oxide film 2 is selected to cause the p⁻ drift layers 4 and n⁻ drift layers 5 to completely deplete due to the depletion from the pn junction interface of the p⁻ drift layers 4 and the n⁻ drift layers 5 before a depletion layer 14 reaches a bottom portion of the p⁻ drift layers 4, no undepleted region is left in part of the p⁻ drift layers 4. Thus, high withstand voltage can be realized.

For example, a pitch of repetition of the p⁻ drift layers 4 and n⁻ drift layers 5 (a width of the layers 4 and 5) is set to be 0.5 $\mu$m, and a depth of the layers 4 and 5 is set to be 5 $\mu$m. The p type and n type impurity concentrations of the layers 4 and 5 are set to be $1.0 \times 10^{17}$ cm$^{-3}$ respectively. A thickness of the n⁻ active layers 3, which is a distance from the bottom surface of the p⁻ drift layers 4 to the interface between the n⁻ active layers 3 and the buried oxide film 2, is set to be 5 $\mu$m. The n type impurity concentration of the n⁻ active layers 3 under the p⁻ drift layers is set to be $2.0 \times 10^{15}$ cm$^{-3}$. A drift length is 5 $\mu$m, and a withstand voltage and an ON resistance are 107 V and 50 m$\Omega \cdot$mm$^2$, respectively.

In this manner, complete depletion can be realized for the p⁻ drift layers 4 and the n⁻ drift layers 5. This can increase the dosage of an impurity to a first conductivity type drift layer, thus reducing ON resistance.

Here, it is preferred that the dosage of an n impurity of the n⁻ active layer 3 underneath the p⁻ layers 4 is in a range of from $1.0 \times 10^{12}$ cm$^{-2}$ to $2.5 \times 10^{12}$ cm$^{-2}$ (and more preferably to $2.0 \times 10^{12}$ cm$^{-1}$). With a lower dosage than this range, the depletion layer 14 readily reaches the p⁻ drift layers 4. Accordingly, the further increase of drain voltage causes the depletion layer to extend also to the n⁻ drift layers 5. Thus, the p⁻ layers 4 are left undepleted similarly to the background structure, lowering withstand voltage. On the other hand, with a higher dosage than the above range, the device is readily broken down before complete depletion in the n⁻ drift layers 5, making it difficult to obtain the high withstand voltage.

Meanwhile, the pitch of repetition of the p⁻ drift layers 4 and the n⁻ drift layers 5 (predetermined interval and predetermined width) is preferably from 0.1 μm to 5 μm (and more preferably 0.5 μm to 5 μm). With a smaller pitch than this, the n⁻ drift layers 5 as current paths are readily depleted due to a built-in potential at the pn junction between the p⁻ drift layers 4 and the n⁻ drift layers 5, making it difficult to obtain low ON resistance. As a result, ON voltage increases. On the other hand, with a greater pitch than the above range, the n⁻ drift layers 5 cannot be increased in n impurity dosage in order to achieve complete depletion thereof, making it difficult to obtain the low ON resistance (low ON voltage).

Further, the interval of the p⁻ drift layers 4, i.e. the width of the n⁻ drift layer 5 and the width of the p⁻ drift layer 4, is usually the same. However, because electrons flow through the regions of the n⁻ drift layers 5, the p⁻ drift layers 4 may be narrower in width than the n⁻ drift layers 5. Furthermore, the p⁻ drift layers 4 may be narrower in width than 0.5 μm provided that the impurity dosage of the p⁻ drift layers 4 is set below preferable dosage.

It is preferred that the impurity dosage of the p⁻ drift layers 4 and the n⁻ drift layers 5 in a repetitive direction is in a range of from $1.0 \times 10^{12}$ cm$^{-2}$ to $5.0 \times 10^{12}$ cm$^{-2}$. With a lower dosage than this range, ON resistance cannot be sufficiently decreased. On the other hand, with a higher dosage than the above range, breakdown occurs in the device before complete depletion in the p⁻ drift layers 4 and the n⁻ drift layers 5, thus making it difficult to obtain high withstand voltage.

Comparing the withstand voltages between the device according to the present invention and the device of the background art of FIGS. 10–14, for the case of a drift length of 10 μm, the device of the background art had a withstand voltage of 73 V whereas the device of the present invention had a withstand voltage of as high as 104 V.

Figure 6:
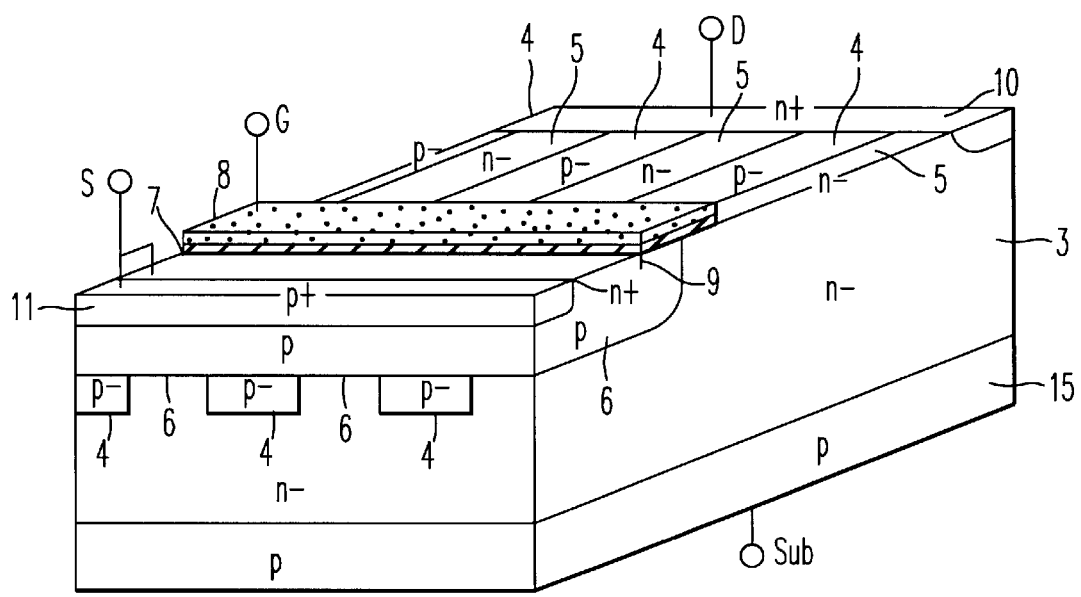
FIG. 6 is a sectional perspective view of a lateral power MOSFET having a multi-resurf layer according to the second embodiment of the present invention.
Figure 7:
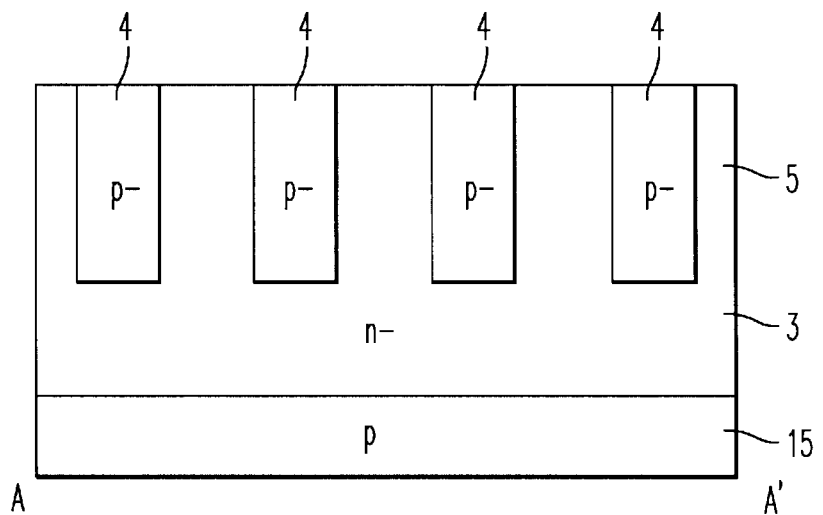
FIG. 7 is a sectional view of the power MOSFET shown in FIG. 6 corresponding to FIG. 3.
Figure 8:
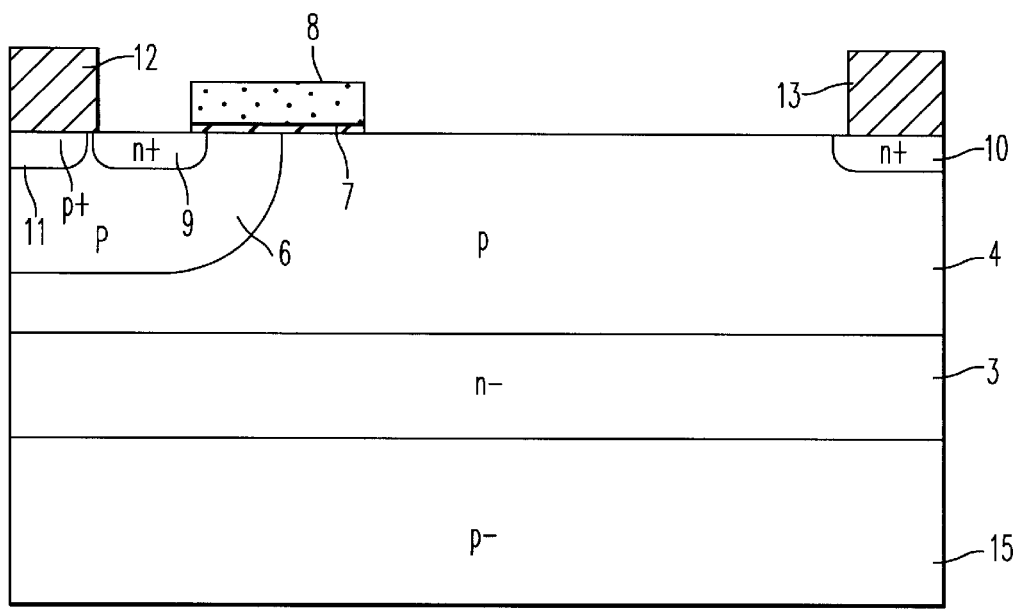
FIG. 8 is a sectional view of the power MOSFET shown in FIG. 6 corresponding to FIG. 4.
Figure 9:
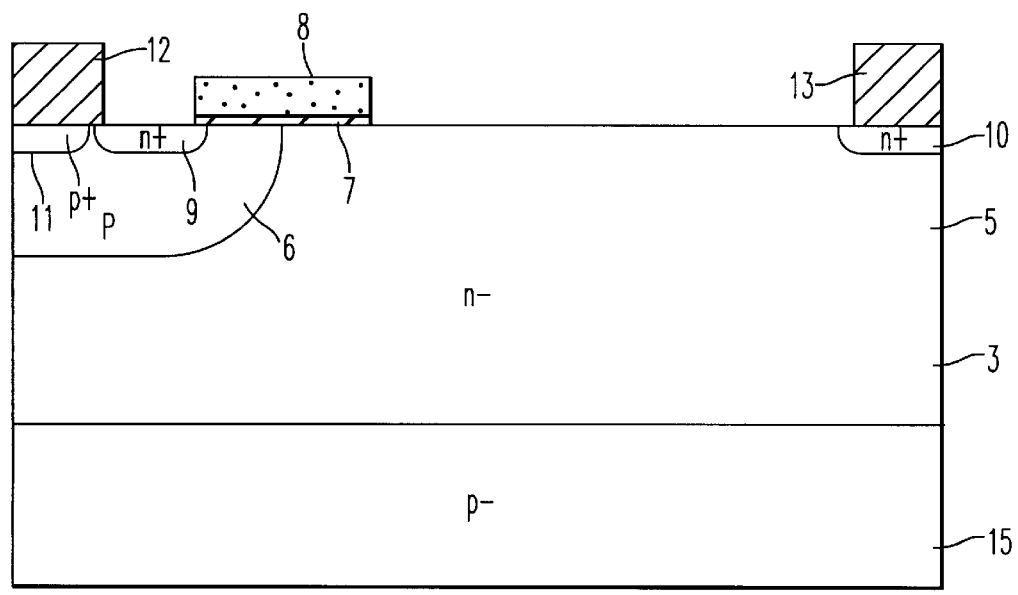
FIG. 9 is a sectional view of the power MOSFET shown in FIG. 6 corresponding to FIG. 5.
Figure 10:
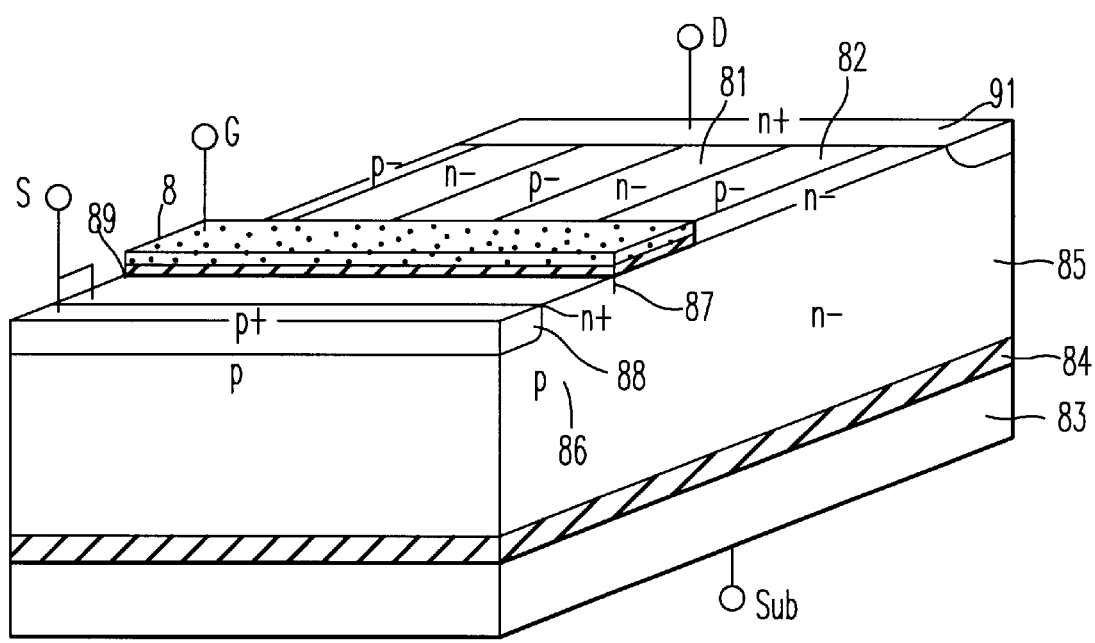
FIG. 10 is a section perspective view of a background lateral power MOSFET having a multi-resurf layer.
Figure 11:
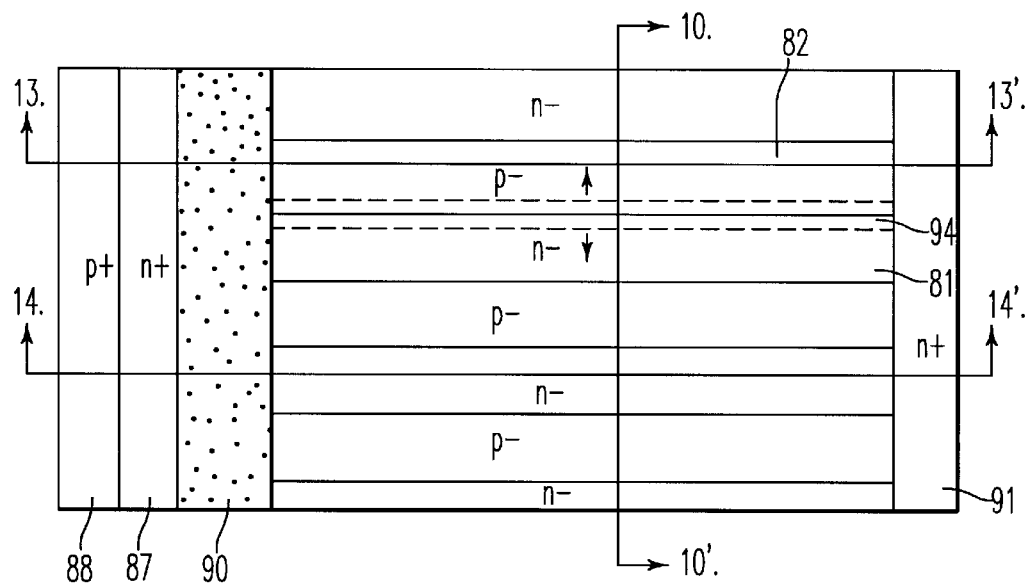
FIG. 11 is a plan view of the power MOSFET shown in FIG. 10.
Figure 12:
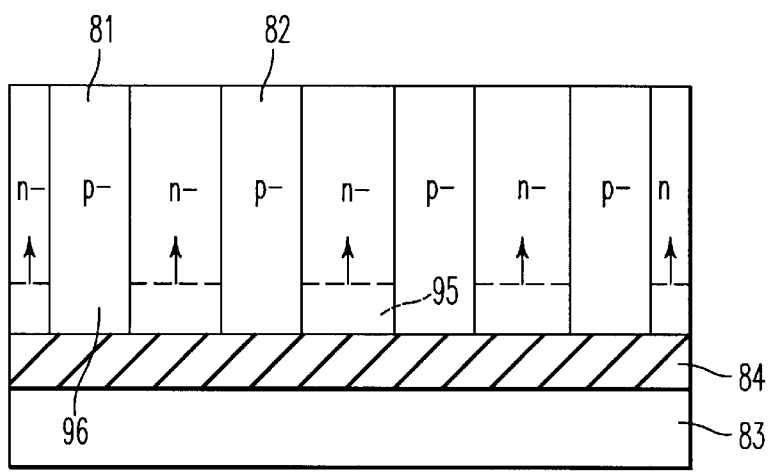
FIG. 12 is a sectional view taken along line A–A' in FIG. 11.
Figure 13:
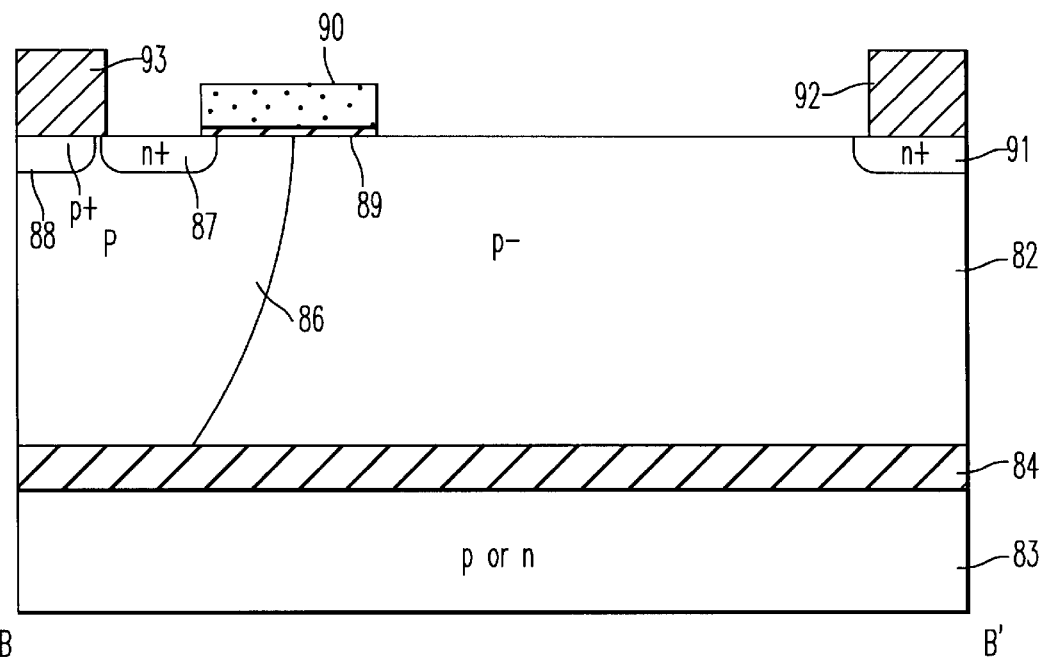
FIG. 13 is a sectional view taken along line B–B' in FIG. 11.
Figure 14:
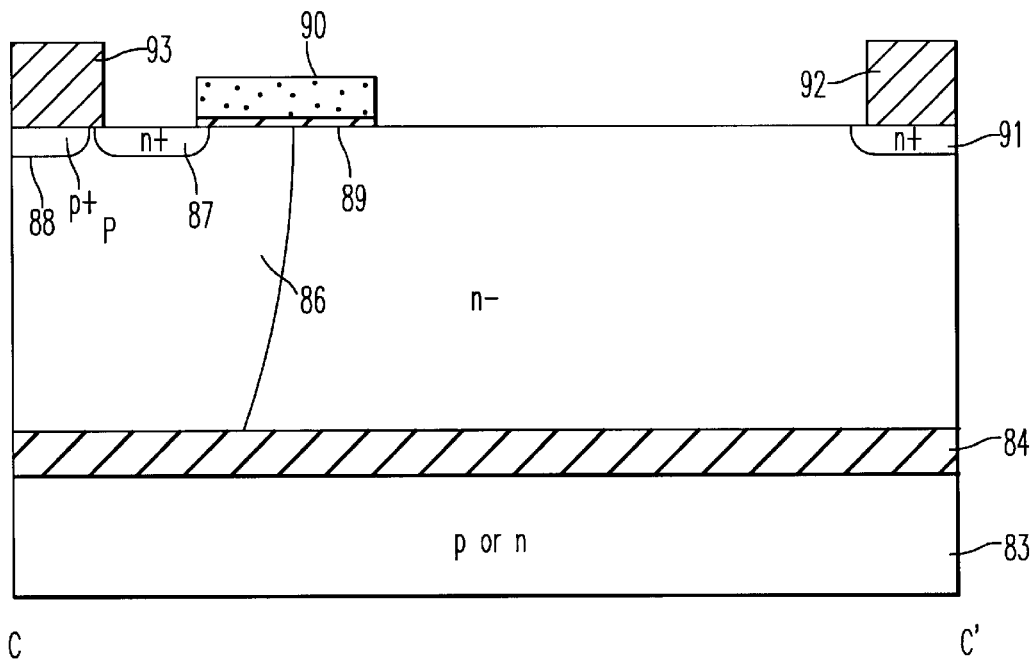
FIG. 14 is a sectional view taken along line C–C' in FIG. 11.

A modification to the present device is shown in FIG. 6 to FIG. 9. FIG. 6 illustrates a sectional perspective view of a lateral power MOSFET having a multi-resurf layer according to the second embodiment of the present invention. FIG. 7, FIG. 8, and FIG. 9 respectively correspond to FIG. 3, FIG. 4 and FIG. 5. No plan view is shown because of the similarity to FIG. 2. This modification employs a p⁻ substrate 15 in place of an SOI substrate. An n⁻ active layer 3 is formed at a surface of the p⁻ substrate 15. By manufacturing the same device structure as in the first embodiment in this n⁻ active layer 3, similar effects are obtainable.

In the embodiments as described above, although explanation was made of the case that p⁻ drift layers 4 are formed in a region from the n⁺ drain diffusion layer 10 to the p⁺ contact layer 11, it may be satisfactorily provided in a region between the n⁺ drain diffusion layer 10 and the p body layer 6.

Also, in the above embodiments, although explanation was made of the case that the n⁻ drift layers 5 are the n⁻ active layer 3 itself, they may be separately formed due to ion implant or the like.

Moreover, in the present embodiments explanation was made of the case using a substrate having a support substrate 1 present under a buried oxide film 2 (insulation region). However, the present invention is applicable to a case using an insulative substrate, such as an SOS (Silicon On sapphire) substrate.

As explained in detail above, according to the present invention complete depletion is possible for the first conductivity type drift layer and the second conductivity type drift layer. Hence, low ON resistance and high withstand voltage are satisfied at the same time. Thus, it is possible to realize a power semiconductor device provided with a lateral power MOSFET having a multi-resurf layer.

Obviously, numerous modifications and variations of the present invention are possible in light of the above teachings. It is therefore to be understood that within the scope of the appended claims, the present invention may be practiced otherwise than as specifically described herein.

The present document is based and claims priority on Japanese Patent Application 10-0285,455 filed in the Japanese Patent Office on Oct. 7, 1998, the entire contents of which are hereby incorporated herein by reference.

What is claimed is:

1. A power semiconductor device comprising:
   a first conductivity type active layer provided on an insulation region;
   a second conductivity type base layer selectively formed on a surface of said first conductivity type active layer;
   a first conductivity type source layer selectively formed on a surface of said second conductivity type base layer;
   a first conductivity type drain layer selectively formed on a surface of said first conductivity type active layer;
   a gate electrode facing, through a gate insulating film, a surface region of said second conductivity type base layer between said first conductivity type source layer and said first conductivity type active layer;
   a plurality of first and second conductivity type semiconductor regions formed between said second conductivity type base layer and said first conductivity type drain layer, each of said second conductivity type semiconductor regions arranged alternately with each of said first conductivity type semiconductor regions, a drain current flowing from said first conductivity type source layer to said first conductivity type drain layer through said first conductivity type semiconductor regions,
   wherein said plurality of first and second conductivity type semiconductor regions are formed above said insulation region with said first conductivity type active layer interposed therebetween.

2. A power semiconductor device according to claim 1, wherein a dosage of a first conductivity type impurity in said first conductivity type active layer is in a range from $1.0 \times 10^{12}$ cm$^{-2}$ to $2.5 \times 10^{12}$ cm$^{-2}$.

3. A power semiconductor device according to claim 1, wherein said plurality of first and second conductivity type semiconductor regions are arranged at a pitch of repetition of 0.1 μm to 5 μm.

4. A power semiconductor device according to claim 1, wherein an impurity dosage in said first conductivity type semiconductor regions and an impurity dosage in said second conductivity type semiconductor regions are in a range from $1.0 \times 10^{12}$ cm$^{-2}$ to $5.0 \times 10^{12}$ cm$^{-2}$ in a direction of arrangement thereof.

5. A power semiconductor device according to claim 1, wherein each of said plurality of first and second conductivity type semiconductor regions is formed in a striped pattern.

6. A power semiconductor device according to claim 1, wherein the insulation region is formed on a semiconductor substrate.

7. A power semiconductor device comprising:
a first conductivity type active layer provided on an insulation region;
a second conductivity type base layer selectively formed on a surface of said first conductivity type active layer;
a first conductivity type source layer selectively formed on a surface of said second conductivity type base layer;
a first conductivity type drain layer selectively formed on a surface of said first conductivity type active layer;
a gate electrode facing, through a gate insulating film, a surface region of said second conductivity type base layer between said first conductivity type source layer and said first conductivity type active layer;
a plurality of first and second conductivity type semiconductor regions formed between said second conductivity type base layer and said first conductivity type drain layer and formed above said insulation region with said first conductivity type active layer interposed therebetween, each of said second conductivity type semiconductor regions arranged alternately with each of said first conductivity type semiconductor regions and arranged in a direction crossing a direction from said first conductivity type source layer to said first conductivity type drain layer.

8. A power semiconductor device according to claim 7, wherein a dosage of a first conductivity type impurity in said first conductivity type active layer is in a range from $1.0 \times 10^{-12}$ cm$^{-2}$ to $2.5 \times 1.0^{12}$ cm$^{-2}$.

9. A power semiconductor device according to claim 7, wherein said plurality of first and second conductivity type semiconductor regions are arranged at a pitch of repetition of 0.1 μm to 5 μm.

10. A power semiconductor device according to claim 7, wherein an impurity dosage in said first conductivity type semiconductor regions and an impurity dosage in said second conductivity type semiconductor regions are in a range from $1.0 \times 10^{12}$ cm$^{-2}$ to $5.0 \times 10^{12}$ cm$^{-2}$ in a direction of arrangement thereof.

11. A power semiconductor device according to claim 7, wherein each of said plurality of first and second conductivity type semiconductor regions is formed in a striped pattern.

12. A power semiconductor device according to claim 7, wherein said first and second conductivity type semiconductor regions are arranged substantially perpendicularly to a direction from said first conductivity type source layer to said first conductivity type drain layer.

13. A power semiconductor device according to claim 7, wherein the insulation region is formed on a semiconductor substrate.

14. A power semiconductor device comprising:
a first conductivity type active layer provided on an insulation region;
a second conductivity type base layer selectively formed on a surface of said first conductivity type active layer;
a first conductivity type source layer selectively formed on a surface of said second conductivity type base layer;
a first conductivity type drain layer selectively formed on a surface of said first conductivity type active layer;
a gate electrode facing, through a gate insulating film, a surface region of said second conductivity type base layer between said first conductivity type source layer and said first conductivity type active layer;
a plurality of first and second conductivity type semiconductor regions formed between said second conductivity type base layer and said first conductivity type drain layer and formed on a surface of said first conductivity type active layer, each of said second conductivity type semiconductor regions arranged alternately with each of said first conductivity type semiconductor regions, a drain current flowing from said first conductivity type source layer to said first conductivity type drain layer through said first conductivity type semiconductor regions,
wherein said plurality of fist and second conductivity type semiconductor regions are formed above said insulation region with said first conductivity type active layer interposed therebetween, and
wherein said plurality of first and second conductivity type semiconductor regions are depleted from junction interfaces thereof before a depletion layer extending from a surface of said insulation region reaches bottom portions of said second conductivity type semiconductor regions.

15. A power semiconductor device comprising:
a first conductivity type active layer formed on a second conductivity type semiconductor substrate;
a second conductivity type base layer selectively formed on a surface of said first conductivity type active layer;
a first conductivity type source layer selectively formed on a surface of said second conductivity type base layer;
a first conductivity type drain layer selectively formed on a surface of said first conductivity type active layer;
a gate electrode facing, through a gate insulating film, a surface region of said second conductivity type base layer between said first conductivity type source layer and said first conductivity type active layer;
a plurality of first and second conductivity type semiconductor regions formed between said second conductivity type base layer and said first conductivity type drain layer, each of said second conductivity type semiconductor regions arranged alternately with each of said first conductivity type semiconductor regions, a drain current flowing from said first conductivity type source layer to said first conductivity type drain layer through said first conductivity type semiconductor regions,
wherein said plurality of first and second conductivity type semiconductor regions are formed above said second conductivity type semiconductor substrate with said first conductivity type active layer interposed therebetween.

16. A power semiconductor device according to claim 15, wherein a dosage of a first conductivity type impurity in said first conductivity type active layer is in a range from $1.0 \times 10^{12}$ cm$^{-2}$ to $2.5 \times 10^{12}$ cm$^{-2}$.

17. A power semiconductor device according to claim 15, wherein said plurality of first and second conductivity type semiconductor regions are arranged at a pitch of repetition of 0.1 μm to 5 μm.

18. A power semiconductor device according to claim 15, wherein an impurity dosage in said first conductivity type semiconductor regions and an impurity dosage in said second conductivity type semiconductor regions are in a range from $1.0 \times 10^{12}$ cm$^{-2}$ to $5.0 \times 10^{12}$ cm$^{-2}$ in a direction of arrangement thereof.

19. A power semiconductor device according to claim 15, wherein each of said plurality of first and second conductivity type semiconductor regions is formed in a striped pattern.

20. A power semiconductor device comprising:
a first conductivity type active layer formed on a second conductivity type semiconductor substrate;
second conductivity type base layer selectively formed on a surface of said first conductivity type active layer;
a first conductivity type source layer selectively formed on a surface of said second conductivity type base layer;
a first conductivity type drain layer selectively formed on a surface of said first conductivity type active layer;
a gate electrode facing, through a gate insulating film, a surface region of said second conductivity type base layer between said first conductivity type source layer and said first conductivity type active layer;
a plurality of first and second conductivity type semiconductor regions formed between said second conductivity type base layer and said first conductivity type drain layer and formed above said second conductivity type semiconductor substrate with said first conductivity type active layer interposed therebetween, each of said second conductivity type semiconductor regions arranged alternately with each of said first conductivity type semiconductor regions and arranged in a direction crossing a direction from said first conductivity type source layer to said first conductivity type drain layer.

21. A power semiconductor device according to claim 20, wherein a dosage of a first conductivity type impurity in said first conductivity type active layer is in a range from $1.0\times10^{12}$ cm$^{-2}$ to $2.5\times10^{12}$ cm$^{-2}$.

22. A power semiconductor device according to claim 20, wherein said plurality of first and second conductivity type semiconductor regions are arranged at a pitch of repetition of 0.1 μm to 5 μm.

23. A power semiconductor device according to claim 20, wherein an impurity dosage in said first conductivity type semiconductor regions and an impurity dosage in said second conductivity type semiconductor regions are in a range from $1.0\times10^{12}$ cm$^{-2}$ to $5.0\times10^{12}$ cm$^{-2}$ in a direction of arrangement thereof.

24. A power semiconductor device according to claim 20, wherein each of said plurality of first and second conductivity type semiconductor regions is formed in a striped pattern.

25. A power semiconductor device according to claim 20, wherein said first and second conductivity type semiconductor regions are arranged substantially perpendicularly to a direction from said first conductivity type source layer to said first conductivity type drain layer.

26. A power semiconductor device comprising:
a first conductivity type active layer formed on a second conductivity type semiconductor substrate;
a second conductivity type base layer selectively formed on a surface of said first conductivity type active layer;
a first conductivity type source layer selectively formed on a surface of said second conductivity type base layer;
a first conductivity type drain layer selectively formed on a surface of said first conductivity type active layer;
a gate electrode facing, through a gate insulating film, a surface region of said second conductivity type base layer between said first conductivity type source layer and said first conductivity type active layer;
a plurality of first and second conductivity type semiconductor regions formed between said second conductivity type base layer and said first conductivity type drain layer and formed on a surface of said first conductivity type active layer, each of said second conductivity type semiconductor regions arranged alternately with each of said first conductivity type semiconductor regions, a drain current flowing from said first conductivity type source layer to said first conductivity type drain layer through said first conductivity type semiconductor regions,
wherein said plurality of first and second conductivity type semiconductor regions are formed above said second conductivity type semiconductor substrate with said first conductivity type active layer interposed therebetween, and
wherein said plurality of first and second conductivity type semiconductor regions are completely depleted from junction interfaces thereof before a depletion layer extending from a surface of said second conductivity type semiconductor substrate reaches bottom portions of said second conductivity type semiconductor regions.

27. A power semiconductor device according to claim 1, wherein a dosage of a first conductivity type impurity to said first conductivity type active layer ranges from $1.0\times10^{12}$ cm$^{-2}$ to $2.5\times10^{12}$ cm$^{-2}$,
a dosage to said first conductivity type semiconductor regions and a dosage to said second conductivity type semiconductor regions range from $1.0\times10^{12}$ cm$^{-2}$ to $5.0\times10^{12}$ cm$^{-2}$ in a direction of arrangement thereof, and
wherein said plurality of first and second conductivity type semiconductor regions are arranged at the pitch of repetition of 0.1 μm to 5 μm.

28. A power semiconductor device according to claim 7, wherein a dosage of a first conductivity type impurity to said first conductivity type active layer ranges from $1.0\times10^{12}$ cm$^{-2}$ to $2.5\times10^{12}$ cm$^{-2}$,
a dosage to said first conductivity type semiconductor regions and a dosage to said second conductivity type semiconductor regions range from $1.0\times10^{12}$ cm$^{-2}$ to $5.0\times10^{12}$ cm$^{-2}$ in a direction of arrangement thereof, and
wherein said plurality of first and second conductivity type semiconductor regions are arranged at the pitch of repetition of 0.1 μm to 5 μm.

29. A power semiconductor device according to claim 15, wherein a dosage of a first conductivity type impurity to said first conductivity type active layer ranges from $1.0\times10^{12}$ cm$^{-2}$ to $2.5\times10^{12}$ cm$^{-2}$,
a dosage to said first conductivity type semiconductor regions and a dosage to said second conductivity type semiconductor regions range from $1.0\times10^{12}$ cm$^{-2}$ to $5.0\times10^{12}$ cm$^{-2}$ in a direction of arrangement thereof, and
wherein said plurality of first and second conductivity type semiconductor regions are arranged at the pitch of repetition of 0.1 μm to 5 μm.

30. A power semiconductor device according to claim 20, wherein a dosage of a first conductivity type impurity to said first conductivity type active layer ranges from $1.0\times10^{12}$ cm$^{-2}$ to $2.5\times10^{12}$ cm$^{-2}$,
a dosage to said first conductivity type semiconductor regions and a dosage to said second conductivity type semiconductor regions range from $1.0\times10^{12}$ cm$^{-2}$ to $5.0\times10^{12}$ cm$^{-2}$ in a direction of arrangement thereof, and
wherein said plurality of first and second conductivity type semiconductor regions are arranged at the pitch of repetition of 0.1 μm to 5 μm.

* * * * *